(12) United States Patent
Otsuka (10) Patent No.: US 6,466,487 B2
(45) Date of Patent: Oct. 15, 2002

(54) SEMICONDUCTOR DEVICE WITH IMPEDANCE CONTROLLABLE OUTPUT BUFFER

(75) Inventor: Nobuaki Otsuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/951,965

(22) Filed: Sep. 14, 2001

(65) Prior Publication Data

US 2002/0034103 A1 Mar. 21, 2002

(30) Foreign Application Priority Data

Sep. 18, 2000 (JP) .......................... 2000-282482

(51) Int. Cl.[7] ................................................ G11C 7/10
(52) U.S. Cl. .......................... 365/189.05; 365/189.08; 326/27; 326/26; 326/30; 326/86; 326/87
(58) Field of Search ....................... 365/189.05, 189.08, 365/226, 189.11; 326/27, 26, 30, 86, 87, 83

(56) References Cited

U.S. PATENT DOCUMENTS

| | | | | |
|---|---|---|---|---|
| 5,606,275 A | * | 2/1997 | Farhang et al. | 327/108 |
| 5,754,480 A | * | 5/1998 | Sato | 365/189.05 |
| 5,793,226 A | * | 8/1998 | Park et al. | 326/86 |
| 6,021,071 A | | 2/2000 | Otsuka | 365/189.05 |
| 6,069,515 A | * | 5/2000 | Singh | 327/309 |
| 6,127,849 A | * | 10/2000 | Walker | 326/86 |
| 6,323,687 B1 | * | 11/2001 | Yano | 326/83 |

* cited by examiner

*Primary Examiner*—Andrew Q. Tran
(74) *Attorney, Agent, or Firm*—Banner & Witcoff, Ltd.

(57) ABSTRACT

A semiconductor device carries out programmable impedance control on an output buffer. The semiconductor device has an internal circuit for carrying out a predetermined operation and the output buffer for driving output data from the internal circuit and transferring the driven output data to an output terminal. The output buffer includes an output transistor group for driving the output terminal to a low level and a pre-output circuit group for driving gates of the output transistor group. The internal circuit is driven by a first power source (VDD), and the pre output circuit group is driven by a second power source (VDDQ) that is different from the first power source.

20 Claims, 8 Drawing Sheets

$I_0$ : IDEAL CURRENT VALUE
$I_1$ : VDDQ DRIVING CURRENT VALUE
$I_2$ : VDD DRIVING CURRENT VALUE (WORST)

FIG.11

(VDDQ<VDD)

SEMICONDUCTOR DEVICE WITH IMPEDANCE CONTROLLABLE OUTPUT BUFFER

CROSS REFERENCE TO RELATED APPLICATIONS

This application claims benefit of priority under 35 USC 119 to Japanese Patent Application No. P2000-282482 filed on Sep. 18, 2000, the entire contents of which are incorporated by reference herein.

BACKGROUND OF THE INVENTION

1. Field of the Invention

The present invention relates to a semiconductor device with an output buffer for providing data to an output terminal such as an I/O pad. In particular, the present invention relates to a semiconductor device such as a memory with an output buffer whose impedance is controllable to external impedance.

2. Description of the Related Art

MPUs (microprocessor units) are increasing their performance to require high-speed memories. Some memories such as external cache memories must operate at several hundred megahertz. When transferring data from a memory to an MPU at such high speed, signal reflection that impairs signal transmission occurs in a data bus on a board where the MPU and memory are installed. To avoid such impairment, the impedance of an output buffer of the memory must be equalized with the impedance of the data bus. The faster a semiconductor device operates, the higher the accuracy of impedance control is required for the semiconductor device. There is a need of controlling the impedance of an output buffer, to correct various impedance deviations occurring on the output buffer.

Manufacturing variations and operating conditions such as temperatures and voltages of a semiconductor device cause the driving characteristics of output buffer transistors of the semiconductor device to deviate from designed characteristics. To correct the deviations and adjust the driving characteristics of the output buffer transistors to the designed ones by changing impedance of the output buffer circuitally, the semiconductor device must have a programmable impedance control function.

Figure 1:
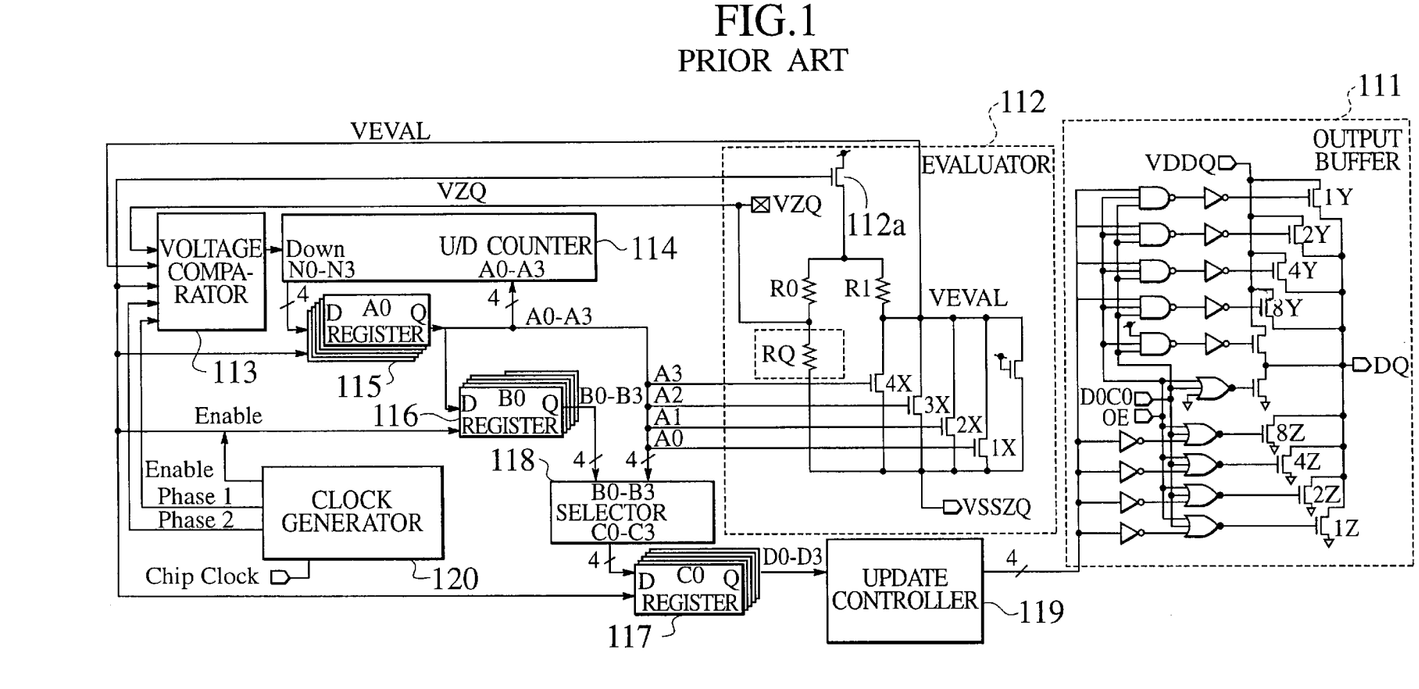
FIG. 1 shows an example of an output buffer with a dummy buffer to control the impedance of pull-up and pull-down transistors according to a prior art.

FIG. 1 shows an example of a circuit realizing the programmable impedance control function according to a prior art. This circuit is disclosed in ISSCC 96 FA 9.3 "A 300 MHz, 3.3 V 1 Mb SRAM Fabricated in a 0.5 $\mu$m CMOS Process." In FIG. 1, an output buffer 111 has pull-up NMOS transistors 1Y, 2Y, 4Y, and 8Y and pull-down NMOS transistors 1Z, 2Z, 4Z, and 8Z. An evaluator 112 has a dummy buffer having transistors 1X, 2X, 3X, and 4X corresponding to the transistors 1Y to 8Y and 1Z to 8Z. In the evaluator 112, a terminal VQ is connected to an external resistor RQ. The resistor RQ has resistance equal to or a multiple of the impedance of a bus which is an impedance control target. An NMOS transistor 112a and resistors R0 and R1 form a reference current source to generate two voltages VZQ and VEVAL, which are compared with each other in a voltage comparator 113. The comparator 113 provides a comparison result to an U/D (up/down) counter 114. The counter 114 equalizes the voltages VZQ and VEVAL with each other by turning on and off the transistors 1X to 4X of the dummy buffer. Namely, the impedance of the dummy buffer is adjusted to the impedance of the external resistor RQ.

Data pieces A0 to A3 used to control the transistors 1X to 4X are transferred to the output buffer 111 through an update controller 119, to selectively turn on and off the transistors 1Y to 8Y and 1Z to 8Z. As a result, the impedance of the output buffer 111 is equalized with the impedance determined by the external resistor RQ.

The pull-up transistors 1Y to 8Y and pull-down transistors 1Z to 8Z in the output buffer 111 are NMOS transistors, and therefore, involve an equal deviation from a designed value. It is possible, therefore, to adjust the impedance of these pull-up and pull-down transistors with the single-system dummy buffer of the NMOS transistors 1X to 4X.

There is also an output buffer composed of pull-up PMOS transistors and pull-down NMOS transistors. For this type of output buffer, it is necessary to prepare a dummy buffer of NMOS transistors and a dummy buffer of PMOS transistors, to separately control the impedance of the pull-up and pull-down sides of the output buffer. Such separate impedance control is necessary because the PMOS transistors involve driving characteristic deviations that are different from those of the NMOS transistors.

Figure 2:
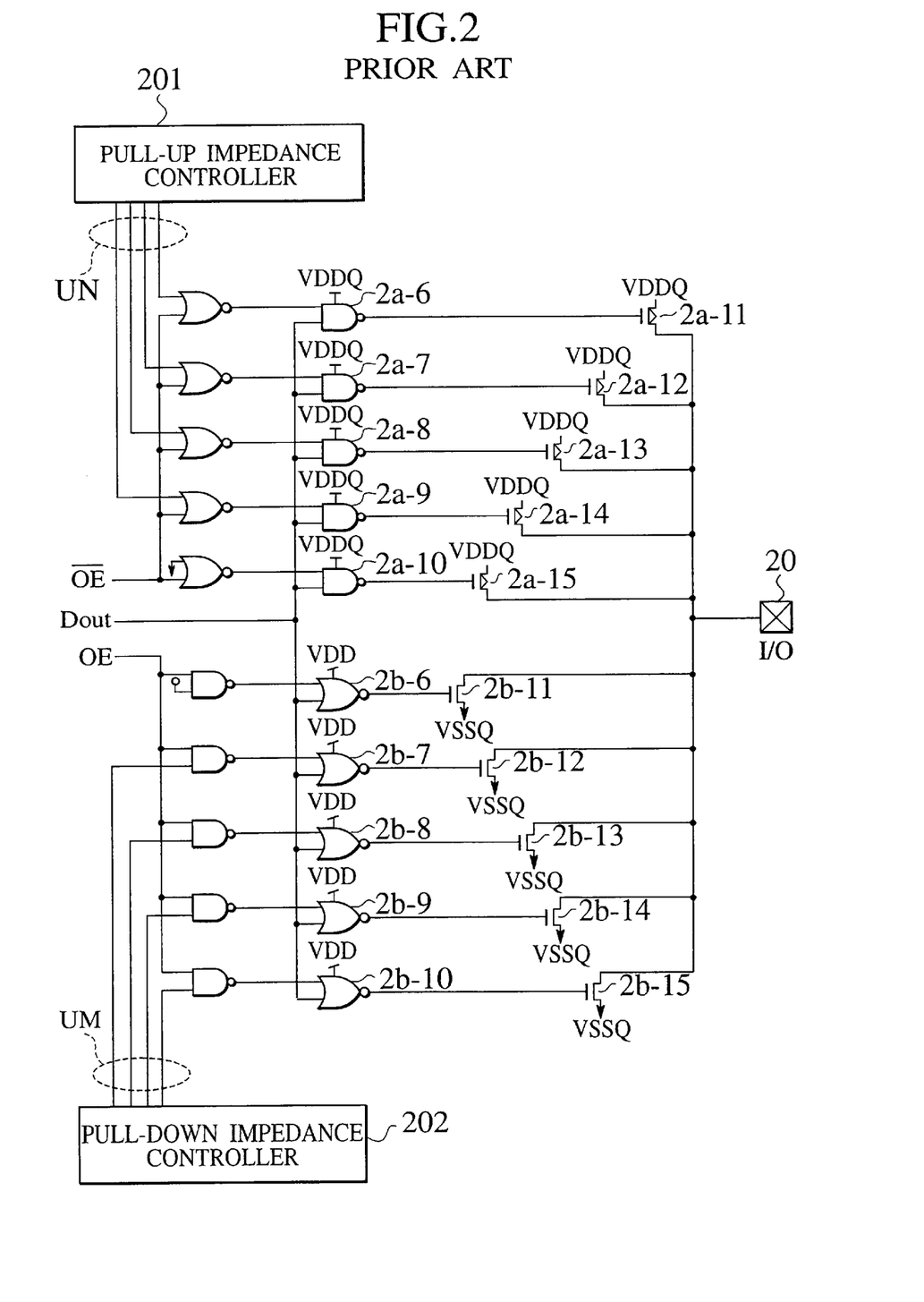
FIG. 2 shows an example of an output buffer with two dummy buffers to separately control the impedance of pull-up and pull-down transistors according to another prior art.

FIG. 2 shows an example of an output buffer employing two dummy buffers to separately control the impedance of pull-up and pull-down transistors according to another prior art. The pull-up transistors in the output buffer are PMOS transistors, and the pull-down transistors therein are NMOS transistors. This output buffer is prepared for a semiconductor device that is driven by standard source voltages VDD and VSS. The output buffer is connected to an I/O pad or an output terminal 20 whose high and low levels are determined based on source voltages VDDQ and VSSQ. The voltage VDDQ is applied to the sources of the pull-up PMOS transistors 2a-11 to 2a-15, and the voltage VSSQ is applied to the sources of the pull-down NMOS transistors 2b-11 to 2b-15. Here, VSSQ=VSS (=0 V), and VDDQ<VDD. These conditions are applied through the following explanation.

The gates of the NMOS transistors 2b-11 to 2b-15 and PMOS transistors 2a-11 to 2a-15 receive the outputs of CMOS circuits 2b-6 to 2b-10 and 2a-6 to 2a-10, respectively. The outputs of these CMOS circuits are logical results of read data Dout, output enable signals OE and /OE, and control signals UN and UM for controlling the impedance of the output buffer. In response to the outputs of the CMOS circuits, the PMOS transistors 2a-11 to 2a-15 and NMOS transistors 2b-11 to 2b-15 are turned on and off.

The gates of the NMOS transistors 2b-11 to 2b-15 receive VDD as a high level voltage and VSS as a low level voltage. The reason why the voltage VSS is applied as a low level voltage to the gates of the NMOS transistors 2b-11 to 2b-15 is because VSSQ=VSS, and therefore, VSS is needed to turn off the NMOS transistors 2b-11 to 2b-15. The reason why VDD is applied as a high level voltage to the gates of the NMOS transistors 2b-11 to 2b-15 is because the CMOS circuits 2b-6 to 2b-10 connected to these NMOS transistors are also driven by VDD, and therefore, it is natural to employ VDD for the NMOS transistors. In addition, a higher gate voltage is preferred to increase the current driving ability of the NMOS transistors 2b-11 to 2b-15, and therefore, VDD that is higher than VDDQ is applied as a high level voltage to the gates of the NMOS transistors 2b-11 to 2b-15.

The prior arts mentioned above have problems. Impedance deviations to be corrected by the programmable impedance control function are caused by manufacturing variations and operating conditions including temperatures and voltages. To correct these deviations, an impedance correction range is set for each output buffer having the programmable impedance control function.

Figure 3:
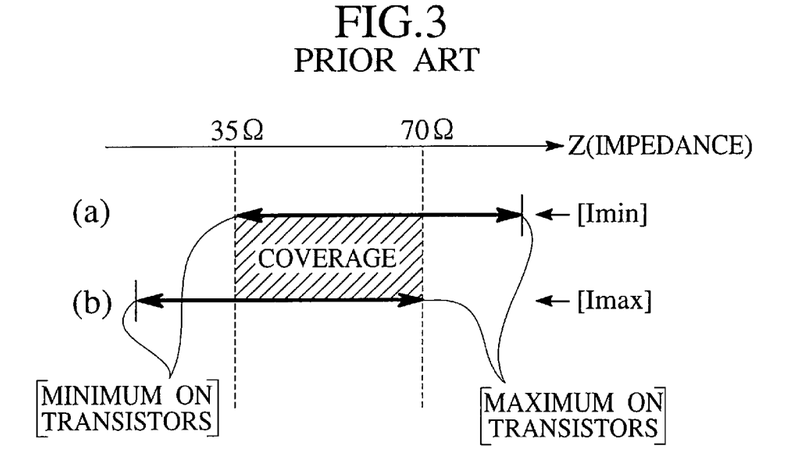
FIGS. 3A and 3B show an impedance control range of an output buffer to cover manufacturing variations and operating conditions.

When all transistors 2a-11 to 2a-15 and 2b-11 to 2b-15 are ON in the output buffer of FIG. 2, the impedance of the output buffer is minimum, and when all of them are OFF, the impedance is maximum. An impedance range between these maximum and minimum impedance values shifts when currents passing through the transistors 2a-11 to 2a-15 and 2b-11 to 2b-15 change due to manufacturing variations or operating conditions. If the currents passing through the transistors decrease, the impedance range shifts to a higher side as shown in FIG. 3A, and if the currents increase, the impedance range shifts to a lower side as shown in FIG. 3B.

If the impedance range of the output buffer of FIG. 2 is between 35 Ω and 70 Ω, the transistors 2a-11 to 2a-15 and 2b-11 to 2b-15 must cover the range of 35 Ω to 70 Ω irrespective of manufacturing variations or operating conditions. Namely, an overlapping part of FIGS. 3A and 3B depicted with hatching lines must secure the range of 35 Ω to 70 Ω. If the manufacturing variations or operating conditions greatly change currents passing through the transistors 2a-11 to 2a-15 and 2b-11 to 2b-15, the impedance of the output buffer greatly shifts. In this case, a large margin must be considered in the impedance range to be secured by the output buffer transistors.

The transistors 2a-11 to 2a-15 and 2b-11 to 2b-15 are connected in parallel and have channel widths set at the ratio of powers of 2. For example, an output buffer having five output transistors divides a specified impedance range by $2^5=32$ to determine the channel width of each of the output transistors. The larger a margin included in the specified impedance range, the larger the intervals of impedance values achieved by the transistors, to deteriorate an impedance control accuracy.

As an example, a correction of an impedance deviation caused by variations in the source voltages VDD and VDDQ will be explained. The source voltages VDD and VDDQ generally involves an allowance of ±5% or ±0.1 V with respect to a reference value. The impedance of the output buffer of FIG. 2 must be controllable against variations within such an allowance. The impedance Z of any one of the NMOS transistors 2b-11 to 2b-15 in the output buffer is defined with respect to a drain level of VDDQ/2. Namely, Z=V/I, where V=VDDQ/2. To keep the impedance Z at a constant level, it is preferable that the current I linearly changes relative to VDDQ.

The NMOS transistors 2b-11 to 2b-15 of FIG. 2 turn on when VDD is applied to their gates. This voltage VDD changes irrelevant to VDDQ. Even when VDDQ and I must stay at constant values, the current I will increase or decrease in response to an increase or decrease in VDD, to fluctuate the impedance Z. Even when the current I must linearly increase in response to an increase in VDDQ, the current I will decrease if VDD drops. Even when the current I must linearly decrease in response to a decrease in VDDQ, the current I will increase if VDD rises.

In this way, the prior art must include a large margin in the channel width of each transistor in an output buffer of a semiconductor device due to VDD variations, thereby increasing a step error in an impedance value set as a target to which the impedance of the output buffer is adjusted.

BRIEF SUMMARY OF THE INVENTION

A first aspect of the present invention provides a semiconductor device having an internal circuit for executing a given operation and an output buffer for driving output data from the internal circuit and providing the driven output data to an output terminal. The output buffer includes an output transistor group for driving the output terminal to a low level and a pre-output circuit group for driving gates of the output transistor group. The internal circuit is driven by a first source voltage VDD, and the pre-output circuit group is driven by a second power source voltage VDDQ that is different from the first source voltage VDD.

A second aspect of the present invention provides a semiconductor device having an internal circuit for executing a given operation and an output buffer for driving output data from the internal circuit and providing the driven output data to an output terminal. The output buffer includes a first output transistor group for driving the output terminal to a low level, a second output transistor group for driving the output terminal to a high level, a first pre-output circuit group for driving gates of the first output transistor group, and a second pre-output circuit group for driving gates of the second output transistor group. The internal circuit is driven by a first source voltage VDD, and the first and second pre-output circuit groups are driven by a second source voltage VDDQ that is different from the first source voltage VDD.

A third aspect of the present invention provides a semiconductor device having an internal circuit for realizing a primary function assigned for the semiconductor device and an output buffer for providing output signals from the internal circuit to an output node. The output buffer drives the output signals according to a high-level source voltage VDDQ and a low-level source voltage VSSQ. The output buffer includes n NMOS transistors having first current-path ends (drains) connected to the output node and second current-path ends (sources) connected to the low-level source voltage VSSQ, and n first logic circuits for driving gates of the n NMOS transistors, respectively. The n NMOS transistors have channel widths of $2^0$ to $2^{(n-1)}$ times a unit channel width, respectively. The n first logic circuits drive the gates of the n NMOS transistors according to a voltage that is equal to the high-level voltage VDDQ and different from a source voltage VDD for driving the internal circuit.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 5:
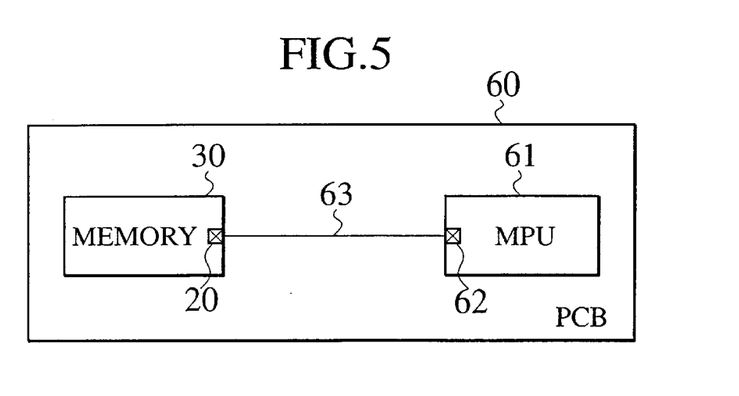
FIG. 5 shows a semiconductor device according to an embodiment of the present invention, including a memory chip and an MPU connected to each other through a data bus on a printed circuit board (PCB)

FIG. 5 shows a semiconductor device according to an embodiment of the present invention. The semiconductor device includes a printed circuit board (PCB) 60, a memory chip 30 installed on the board 60, an MPU 61 installed on the board 60, and a data bus 63 connecting the memory chip 30 and MPU 61 to each other. The data bus 63 connects an I/O pad 20 of the memory chip 30 to an input pad 62 of the MPU 61. The memory chip 30 includes an internal circuit for achieving a specified operation and an output buffer for driving output data from the internal circuit and transferring the driven output data to the I/O pad (output terminal) 20. According to the embodiment, the internal circuit is a memory circuit to realize a primary function, i.e., a memory function of the semiconductor device. The memory chip 30 and MPU 61 may be integrated into a system LSI. In this case, the output terminal 20 is an output node.

Figure 6:
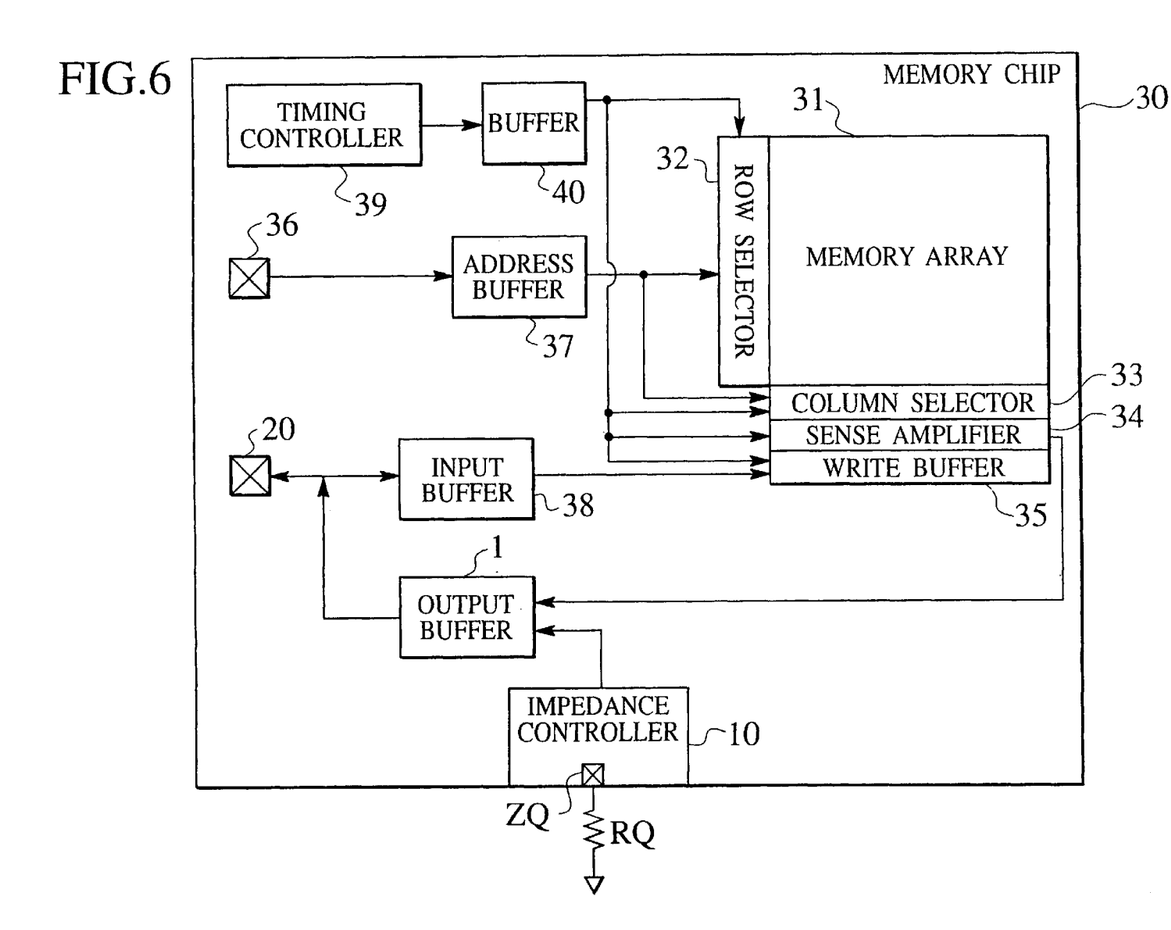
FIG. 6 shows essential parts of the memory chip of FIG. 5, having an output buffer and an impedance controller.

FIG. 6 shows examples of essential parts in the memory chip 30. A memory array 31 has an array of memory cells. A row selector 32 and a column selector 33 select a memory cell. A sense amplifier 34 and a write buffer 35 are connected to the memory array 31. An address pad 36 receives address data. An address buffer 37 is connected to the address pad 36, row selector 32, and column selector 33. The I/O pad 20 is connected to the data bus 63. The I/O pad 20 is also connected to an input buffer 38 and an output buffer 1. An impedance controller 10 automatically controls the impedance of the output buffer 1. A timing controller 39 and a buffer 40 control write and read timing.

Address data is supplied to the address pad 36 from the outside and is passed through the address buffer 37 to the row selector 32 and column selector 33. According to the address data, a write or read memory cell is selected in the memory array 31. For the sake of simplicity, FIG. 6 shows only one address pad 36 and one address buffer 37. In practice, address data consists of n-bit row address data and m-bit column address data. Accordingly, there are n+m address pads 36, and the address buffer 37 consists of n row address buffers and m column address buffers. The n row address buffers are connected to the row selector 32, and the m column address buffers are connected to the column selector 33. Similarly, FIG. 6 shows only one I/O pad 20, one input buffer 38, and one output buffer 1. If the data bus 63 is of k bits, there will actually be k I/O pads 20, k input buffers 38, and k output buffers 1.

To write data into the memory array 31, write data is supplied from the outside to the I/O pad 20, is passed through the input buffer 38 to the write buffer 35, and is written into a specified cell in the memory array 31. To read data from the memory array 31, the data is read out of a specified cell in the memory array 31, is passed through the sense amplifier 34 to the output buffer 1, and is sent through the I/O pad 20 to the outside. The timing controller 39 generates a timing control signal, which is passed through the buffer 40 to the row selector 32, column selector 33, sense amplifier 34, and write buffer 35, to control write and read timing.

The impedance controller 10 has a dummy buffer and an external terminal ZQ. The size of the dummy buffer is equal to or a multiple of the size of the output buffer 1. The external terminal ZQ is connected to an external resistor RQ to specify impedance to which the output buffer 1 is controlled. The impedance controller 10 automatically determines a transistor channel width that equalizes the impedance of the dummy buffer 10 with the external resistor RQ. The determined channel width is reflected on the output buffer 1.

Figure 7:
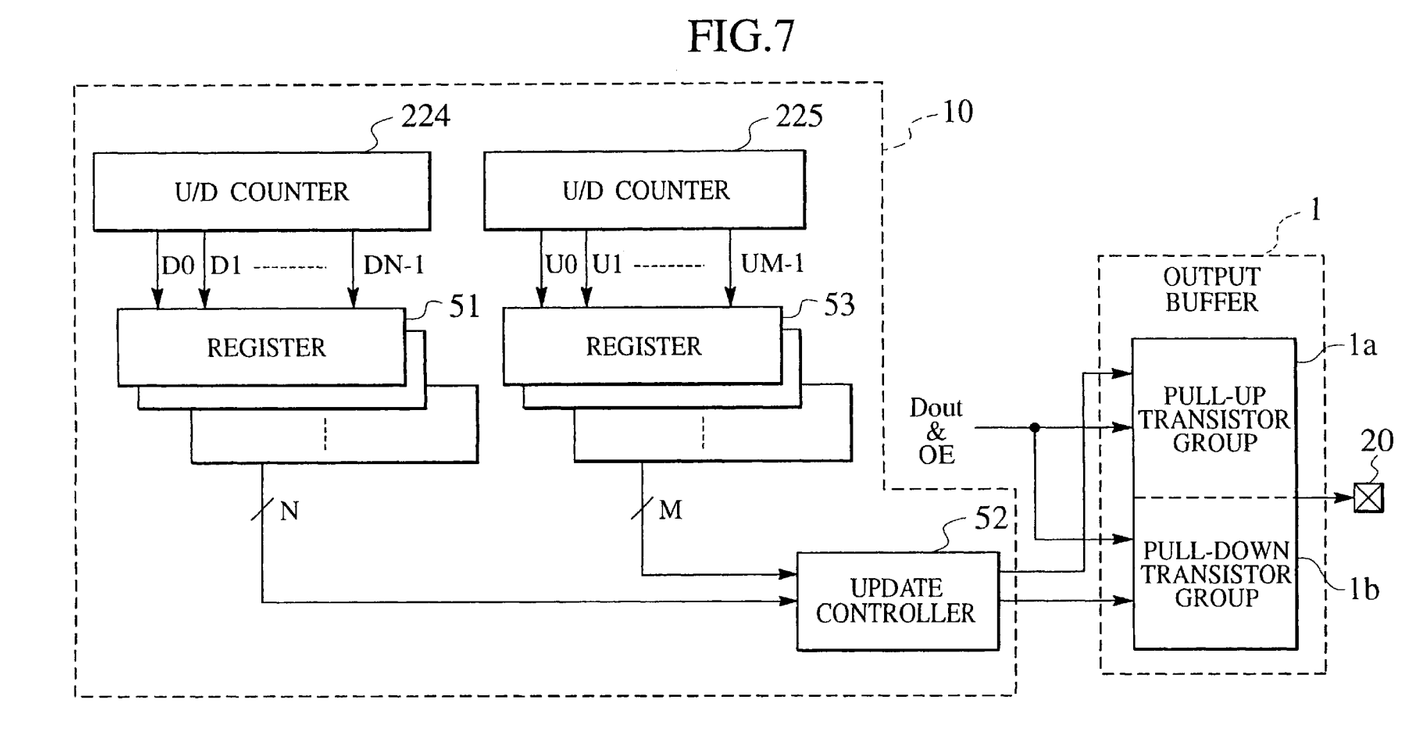
FIG. 7 shows essential parts of the impedance controller of FIG. 6.

FIG. 7 shows essential parts of the output buffer 1 and impedance controller 10. The output buffer 1 includes a pull-up transistor group 1a having PMOS transistors and a pull-down transistor group 1b having NMOS transistors. The impedance controller 10 includes up/down (U/D) counters 224 and 225 for turning on and off dummy buffer transistors, registers 51 and 53 for temporarily storing transistor ON/OFF signals, and an update controller 52 for controlling the transistor ON/OFF signals. The pull-up transistor group 1a and pull-down transistor group 1b contain different types of transistors, and therefore, impedance control on the output buffer 1 is separately carried out by dummy buffer transistors corresponding to the transistor groups 1a and 1b. Namely, the dummy buffer consists of two systems involving the counters 224 and 225 and registers 51 and 53, respectively. The counters 224 and 225 change the channel widths of the dummy buffer transistors by turning on and off the dummy buffer transistors, thereby equalizing the impedance of the dummy buffer with that of the external resistor RQ.

Figure 8:
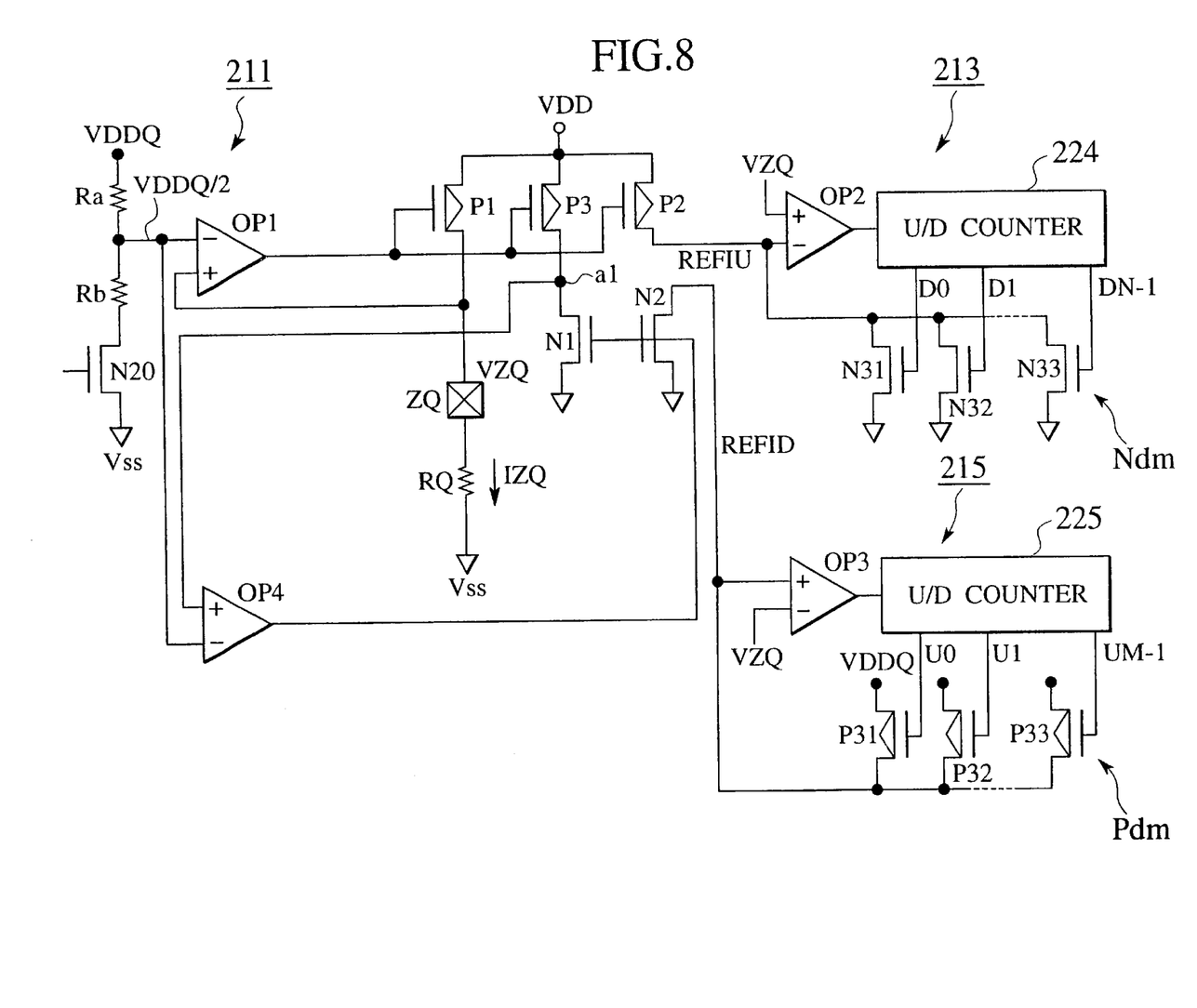
FIG. 8 shows the details of the impedance controller of FIG. 7 having two impedance control systems.

FIG. 8 shows essential parts of the impedance controller 10.

The impedance controller 10 includes a reference current source 211, a pull-down controller 213, and a pull-up controller 215. The pull-down controller 213 includes a pull-down dummy buffer Ndm and the counter 224. The pull-up controller 215 includes a pull-up dummy buffer Pdm and the counter 225. The reference current source 211 includes a reference voltage generator that uses an intermediate voltage VDDQ between a high-level source voltage VDD and a low-level source voltage VSS, to generate a constant voltage for the terminal ZQ. The reference voltage generator includes voltage dividing resistors Ra and Rb and an activation NMOS transistor N20.

The pull-down dummy buffer Ndm includes n NMOS transistors N31 to N3n connected in parallel. These transistors have channel widths having the ratio of $1:2:4:\ldots:2^{(n-1)}$. The counter 224 provides data pieces D0 to Dn−1, which are applied to the gates of the NMOS transistors N31 to N3n, respectively. The pull-up dummy buffer Pdm includes m PMOS transistors P31 to P3m whose gate widths are set at the ratio of $1:2:4:\ldots:2^{(m-1)}$. The counter 225 provide data pieces U0 to Um−1 to gates of the PMOS transistors P31 to P3m, respectively.

The pull-down control system controls the impedance of the pull-down transistor group 1b of the output buffer 1. This will be explained. In FIG. 8, the impedance controller 10 has a PMOS transistor P1 connected to the terminal ZQ in series and a PMOS transistor P2 whose gate and source are connected to those of the PMOS transistor P1, respectively. A level at the PMOS transistor P1 is controlled by an operational amplifier OP1 so that a voltage VZQ at the terminal ZQ is half the source voltage VDDQ for the output buffer 1.

More precisely, the reference voltage generator generates a reference voltage of VDDQ/2. This reference voltage is applied to an inverting input terminal of the operational amplifier OP1. The output of the operational amplifier OP1 is connected to the gates of the PMOS transistors P1 and P2. The sources of the PMOS transistors P1 and P2 receive the voltage VDD. The drain of the PMOS transistor P1 is connected to the terminal ZQ and is fed back to a non-inverting input terminal of the operational amplifier OP1. As a result, the terminal ZQ receives the reference voltage VZQ=VDDQ/2.

The drain of the PMOS transistor P2 is connected to an inverting input terminal of an operational amplifier OP2, and a node REFIU receives the voltage VDDQ/2. A non-inverting input terminal of the operational amplifier OP2 receives the voltage VZQ. The counter 224 provides the data pieces D0 to Dn−1 to selectively turn on and off the NMOS transistors N31 to N3n. The drains of the NMOS transistors N31 to N3n are fed back to the inverting input terminal of the operational amplifier OP2. As a result, the pull-down controller 213 equalizes a voltage at the node REFIU with the reference voltage VZQ (=VDDQ/2) by selectively turning on and off the NMOS transistors N31 to N3n of the dummy buffer Ndm. Namely, the pull-down controller 213 determines the current driving ability, i.e., the size of the dummy buffer Ndm.

As shown in FIG. 7, the data pieces D0 to Dn−1 from the counter 224 are supplied to the update controller 52 through the register 51. Based on these data pieces, the update controller 52 selectively turns on and off the transistors in the pull-down transistor group 1b of the output buffer 1.

The pull-up control system for controlling the impedance of the pull-up transistor group 1a of the output buffer 1 will be explained. In FIG. 8, the impedance controller 10 has a PMOS transistor P3 whose gate and source are connected to those of the PMOS transistor P1, respectively, an NMOS transistor N1 connected to the PMOS transistor P3 in series, and an NMOS transistor N2 whose gate and source are connected to those of the NMOS transistor N1, respectively. An operational amplifier OP4 controls a level at the gate of the NMOS transistor N1, to equalize a voltage at a node a1 between the PMOS transistor P3 and the NMOS transistor N1 with VDDQ/2.

The drain of the NMOS transistor N2 is connected to a non-inverting input terminal of an operational amplifier OP3, and a node REFID receives VDDQ/2. An inverting input terminal of the operational amplifier OP3 receives the voltage VZQ. The counter 225 provides data pieces U0 to Um−1 to selectively turn on and off the PMOS transistors P31 to P3m of the dummy buffer Pdm. The drains of the PMOS transistors P31 to P3m are fed back to the non-inverting input terminal of the operational amplifier OP3. As a result, the pull-up controller 215 equalizes a voltage at the node REFID with the reference voltage VZQ (=VDDQ/2) by selectively turning on and off the PMOS transistors P31 to P3m of the dummy buffer Pdm. Namely, the pull-up controller 215 determines the current driving ability, i.e., the size of the dummy buffer Pdm.

As shown in FIG. 7, the data pieces U0 to Um−1 from the counter 225 are supplied to the update controller 52 through the register 53. Based on the data pieces U0 to Um−1, the update controller 52 selectively turns on and off the transistors in the pull-up transistor group 1a of the output buffer 1.

In this way, the external resistor RQ specifying a control target impedance is connected to the terminal ZQ, and the impedance controller 10 automatically controls the transistor channel widths of the output buffer 1 so that the impedance of the output buffer 1 is equalized with that of the external resistor RQ or a multiple of the impedance of the resistor RQ.

Figure 9:
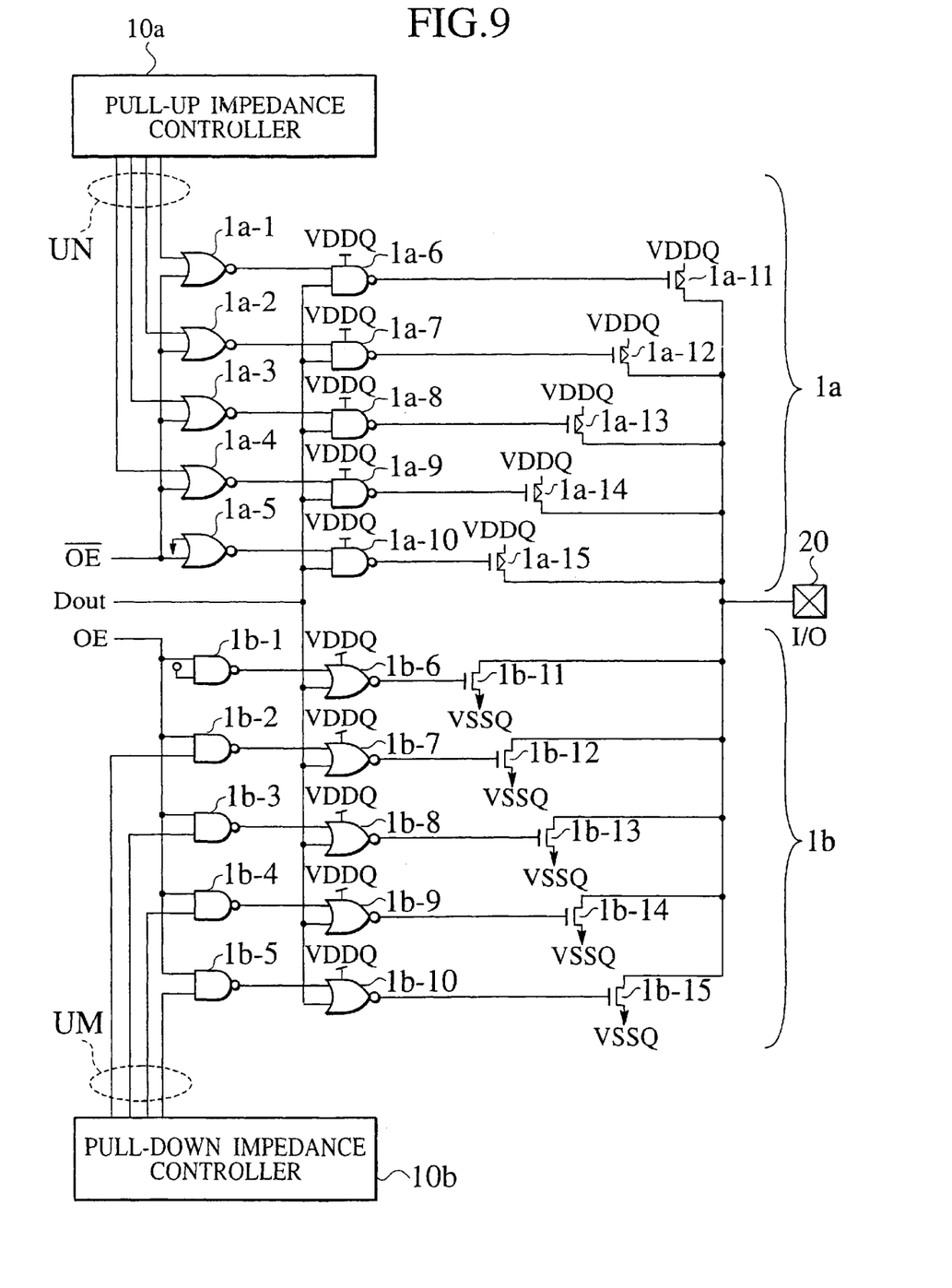
FIG. 9 shows the details of the output buffer of FIG. 7 with pull-down transistors being driven by VDDQ.

FIG. 9 shows an example of the structure of the output buffer 1 according to the embodiment of the present invention. The output buffer 1 includes the pull-down transistor group 1b for driving the output terminal 20 to a low level, the pull-up transistor group 1a for driving the output terminal 20 to a high level, a pre-output circuit group for driving the gates of the pull-down transistor group 1b, and a pre-output circuit group for driving the gates of the pull-up transistor group 1a. The pull down-transistor group 1b includes output transistors 1b-11 to 1b-15, the pull-up transistor group 1a includes output transistors 1a-11 to 1a-15, the pre-output circuit group for the pull-down transistor group 1b includes pre-output CMOS circuits 1b-6 to 1b-10, and the pre-output circuit group for the pull-up transistor group 1a includes pre-output CMOS circuits 1a-6 to 1a-10. The pre-output circuits 1b-6 to 1b-10 are driven by the second source voltage VDDQ that is different from the first source voltage VDD for driving the internal circuit, i.e., the memory circuit. Namely, the output buffer 1 of the embodiment of the present invention differs from the output buffer of the prior art of FIG. 2 in that the pre-output CMOS circuits 1b-6 to 1b-10 for driving the gates of the NMOS transistors 1b-11 to 1b-15 of the embodiment of the present invention are driven by VDDQ instead of VDD.

In FIG. 9, the impedance controller 10 of FIG. 7 is divided into a pull-up impedance controller 10a and a pull-down impedance controller 10b. The pull-up impedance controller 10a controls the pull-up transistor group 1a, and the pull-down impedance controller 10b controls the pull-down transistor group 1b.

The pull-up transistor group 1a includes initial CMOS circuits 1a-1 to 1a-5, the pre-output CMOS circuits 1a-6 to 1a-10, and the output PMOS transistors 1a-11 to 1a-15. The pull-down transistor group 1b includes initial CMOS circuits 1b-1 to 1b-5, the pre-output CMOS circuits 1b-6 to 1b-10, and the output NMOS transistors 1b-11 to 1b-15.

In the pull-up transistor group 1a, the initial CMOS circuits 1a-1 to 1a-5 receive an impedance control signal UN from the impedance controller 10a and an output enable signal /OE. The impedance control signal UN represents the data pieces U0 to Um−1 from the counter 225. The pre-output CMOS circuits 1a-6 to 1a-10 receive output data Dout from the internal circuit and the outputs of the initial CMOS circuits 1a-1 to 1a-5. The outputs (each at VDDQ) of the pre-output CMOS circuits 1a-6 to 1a-10 are applied to the gates of the output PMOS transistors 1a-11 to 1a-15, respectively. A threshold of the pre-output CMOS circuits 1a-6 to 1a-10 is determined according to a difference between the voltages VDD and VDDQ.

In the pull-down transistor group 1b, the initial CMOS circuits 1b-1 to 1b-5 receive an impedance control signal UM from the impedance controller 10b and an output enable signal OE. The impedance control signal UM represents the data pieces D0 to Dn−1 from the counter 224. The pre-output CMOS circuits 1b-6 to 1b-10 receive the output data Dout from the internal circuit and the outputs of the initial CMOS circuits 1b-1 to 1b-5. The outputs (each at VDDQ) of the pre-output CMOS circuits 1b-6 to 1b-10 are applied to the gates of the output NMOS transistors 1b-11 to 1b-15, respectively. A threshold of the pre-output CMOS circuits 1b-6 and 1b-10 is determined according to a difference between the voltages VDD and VDDQ.

The drains of the output PMOS transistors 1a-11 to 1a-15 and NMOS transistors 1b-11 to 1b-15 are commonly connected to the I/O pad 20.

The initial CMOS circuits 1b-1 to 1b-5 provide VDD-level logic to drive the pre-output CMOS circuits 1b-6 to 1b-10, which provide VDDQ-level logic. Since VDDQ is lower than VDD, no level shifter is needed to drive the pre-output CMOS circuits 1b-6 to 1b-10. By tilting the threshold of the pre-output CMOS circuits 1b-6 to 1b-10 according to a difference between VDD and VDDQ, a signal transmission delay will easily be avoided.

According to the embodiment of the present invention, a high gate level to turn on the NMOS transistors 1b-11 to 1b-15 is VDDQ instead of VDD. An impedance correction of the embodiment of the present invention against a source voltage variation will be studied.

Figure 4:
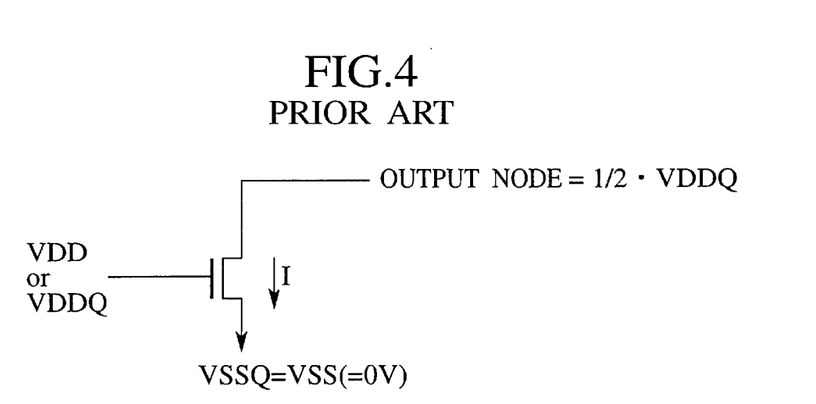
FIG. 4 shows conditions to define the impedance Z of an NMOS transistor at a drain level of VDDQ/2.

In a bias state to define an impedance value, the NMOS transistors 1b-11 to 1b-15 are driven by applying VDDQ to their gates and VDDQ/2 to their drains according to the embodiment. Namely, these transistors are free from the influence of VDD variations, and unlike the prior art of FIG. 4, there is no need of setting a margin for current variations due to VDD variations.

In addition, the embodiment causes smaller impedance variations with respect to VDDQ variations. If VDDQ varies toward a higher side, it is desirable that current linearly increases accordingly. However, the current characteristics of a MOS transistor is nonlinear, and therefore, a drain current of the MOS transistor nonlinearly increases with respect to a drain voltage increase. At this time, the drain current increase is smaller than a linear increase. If VDDQ is applied to the MOS transistor, a VDDQ increase causes a current increase. These relationships are shown in FIG. 10.

Figure 10:
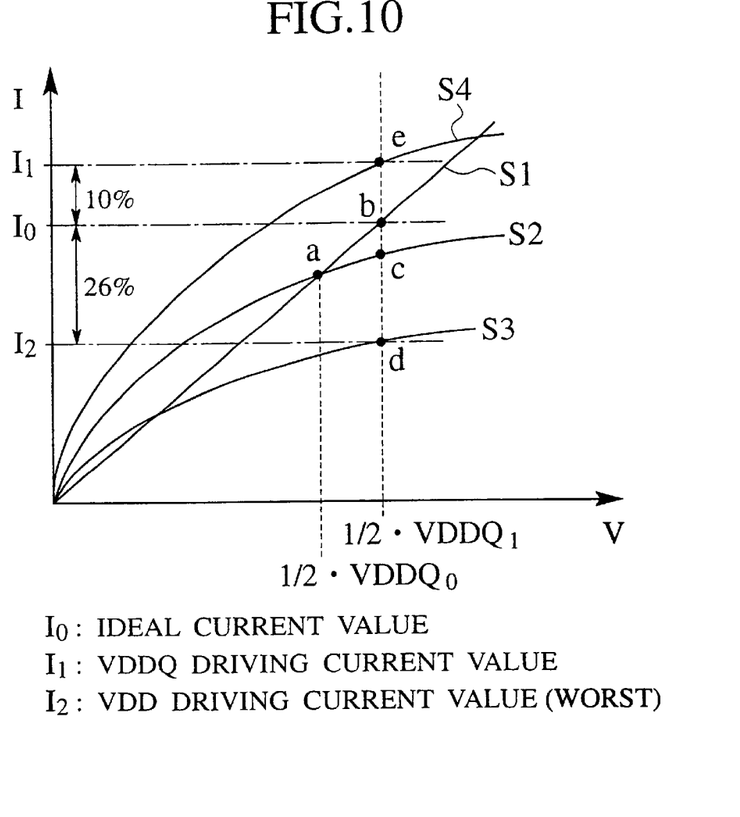
FIG. 10 shows I-V curves of MOS transistors with different VDDQ values.

In FIG. 10, a curve S1 indicates the I-V characteristics of a MOS transistor with an ideal constant impedance value. A curve S2 indicates the I-V characteristics of an actual MOS transistor with VDDQ being a standard value of VDDQ0. The curve S2 intersects the curve S1 at a point "a" with a drain voltage of VDDQ0/2. If VDDQ increases by 0.1 V from VDDQ0 to VDDQ1, a point corresponding to this VDDQ increase is "b" on the ideal curve S1.

If the gate voltage is unchanged, a point corresponding to the VDDQ increase of 0.1 V is "c" on the actual curve S2, the point c being below the ideal point b due to the nonlinearity of the I-V curve S2 of the actual MOS transistor. In practice, it is impossible to keep the gate voltage unchanged. If VDD is applied as conventional to the gate of the MOS transistor and if VDD decreases by 5% from 1.8 V to 1.71 V, the I-V curve of the MOS transistor will be S3 and a point corresponding to the VDDQ increase of 0.1 V will be "d" on the curve S3. This point d on the curve S3 is 26% below the ideal point b, to cause a large error.

Applying VDDQ instead of VDD to the gate of the MOS transistor according to the embodiment of the present invention will be studied. In response to the VDDQ increase of 0.1 V from VDDQ0 to VDDQ1, the gate voltage of the MOS transistor also increases from VDDQ0 to VDDQ1. In this case, the I-V curve of the MOS transistor will be S4 and a point corresponding to the VDDQ increase of 0.1 V will be "e" on the curve S4. This point e is greater than the ideal point b by 10%, which is smaller than half the error of 26% of the case employing the gate voltage of VDD.

The output buffer of the prior art of FIG. 2 drives the gates of the output NMOS transistors 2b-11 to 2b-15 by VDD. This may be natural because the pre-output CMOS circuits 2b-6 to 2b-10 are driven by VDD and because driving the NMOS transistors 2b-11 to 2b-15 by a high voltage (VDD>VDDQ) increases the current driving ability of the output buffer, minimizes a signal delay in the output buffer, and improves the operation speed of the output buffer. Employing the high voltage VDD as a gate voltage, however, causes the problem of signal reflection due to impedance mismatching, as mentioned before.

The programmable impedance control function provided for an output buffer must fundamentally adjust the impedance of the output buffer to that of output load, thereby preventing the signal reflection problem and providing high-speed signals with correct waveforms.

In an LSI of high density operating on a low source voltage, even an allowance of 0.1 V takes a large portion of the source voltage. In such an LSI, each transistor has a severe threshold margin, and therefore, is vulnerable to even a minute variation in the source voltage. As a result, the output buffer of FIG. 2 employing VDD for driving the gates of the pull-down NMOS transistors is disadvantageous.

To solve the disadvantages and problems of the prior art, the embodiment of the present invention drives the gates of the pull-down output NMOS transistors 1b-11 to 1b-15 by VDDQ instead of VDD. Namely, the pre-output circuits 1b-6 to 1b-10 for driving the NMOS transistors 1b-11 to 1-15 operate according to logic determined by VDDQ and VSS. As a result, the output buffer of the embodiment of the present invention is capable of securing current driving ability irrespective of source voltage fluctuations. The programmable impedance control function according to the embodiment of the present invention can secure a required impedance range with smaller channel widths set for the output transistors 1b-11 to 1b-15, thereby realizing precision impedance control.

According to the embodiment of the present invention, the pre-output CMOS circuits 1a-6 to 1a-10 for driving the pull-up PMOS transistors 1a-11 to 1a-15 operate according to VDDQ and VSS. The driving force of the PMOS transistors will increase as the low voltage (VSS) applied to the gates thereof decreases. However, for a standard semiconductor device having no negative voltage generator, VSS is the minimum voltage, and therefore, the output buffer of the embodiment of the present invention employs VSS as a low voltage to drive the PMOS transistors 1a-11 to 1a-15.

Figure 11:
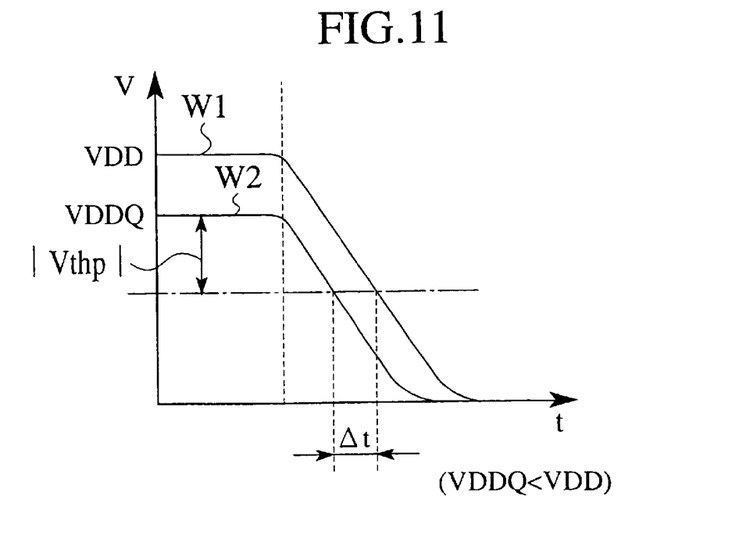
FIG. 11 shows the operation speeds of a PMOS transistor based on different driving voltages.

To turn off the PMOS transistors 1a-11 to 1a-15, VDDQ or a higher voltage must be applied to the gates thereof because VDDQ is a source voltage to these PMOS transistors. In this regard, any one of VDDQ and VDD may be applied to the gates of the PMOS transistors 1a-11 to 1a-15. If VDD higher than VDDQ is chosen, a delay problem will occur in OFF-ON transition. As shown in FIG. 11, VDD involves a delay At in reaching a level of "VDDQ−|Vthp|" compared with VDDQ, thereby deteriorating the performance of the PMOS transistors. Here, "Vthp" is the threshold voltage of a given PMOS transistor. To avoid such delay, the embodiment of the present invention employs VDDQ and VSS to drive the pre-output CMOS circuits 1a-6 to 1a-10 that drive the pull-up PMOS transistors 1a-11 to 1a-15.

In this way, the embodiment of the present invention drives the gates of the pull-up PMOS transistors 1a-11 to 1a-15 by VDDQ, to maintain operation speed. The gates and drains of the PMOS transistors 1a-11 to 1a-15 are controlled by VDDQ, and like the pull-down NMOS transistors 1b-11 to 1b-15, are free from VDD variations.

In summary, the embodiment of the present invention secures the current driving abilities of the output transistors 1a-11 to 1a-15 and 1b-11 to 1b-15 against source voltage fluctuations. This results in minimizing a margin to be included in the channel widths of the output transistors 1a-11 to 1a-15 and 1b-11 to 1b-15 to cover an impedance range in which the impedance of the output buffer is controlled. Due to such small margin in transistor channel width, the embodiment of the present invention is capable of carrying out precision impedance control.

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having an internal circuit and an output buffer for driving output data provided by the internal circuit and transferring the driven output data to an output terminal, the output buffer comprising:
   an output transistor group for driving the output terminal to a low level; and
   a pre-output circuit group for driving gates of the output transistor group,
   wherein the internal circuit being driven by a first power source,
   the pre-output circuit group being driven by a second power source whose voltage level is different from that of the first power source.

2. The semiconductor device of claim 1, wherein:
   the voltage level of the second power source is lower than that of the first power source; and
   a threshold of the pre-output circuit group is set according to a voltage difference between the first and second power sources.

3. The semiconductor device of claim 1, wherein:
   at least part of transistors in the output transistor group form a small transistor group, and the transistors in the small transistor group have channel widths set at the ratio of a power of 2.

4. The semiconductor device of claim 3, further comprising:
   an impedance controller for controlling the impedance of the output buffer,
   wherein the small transistor group including n transistors, where n is a natural number equal to or greater than 2,
   the logic of a signal to drive gates of the n transistors being determined by the pre-output circuit group according to the logic of the output data provided by the internal circuit and the logic of an n-bit control signal provided by the impedance controller.

5. The semiconductor device of claim 3, wherein:
   the small transistor group includes n NMOS transistors having channel widths set at the ratio of $2^0:2^1:\ldots:2^{(n-1)}$ based on a unit channel width, where n is a natural number equal to or greater than 2.

6. The semiconductor device of claim 1, wherein:
   sources of transistors in the output transistor group are connected to a ground voltage and drains thereof are connected to the output terminal.

7. The semiconductor device of claim 1, wherein:
   the output buffer employs the second power source to drive the output data provided by the internal circuit and transfers the driven output data to the output terminal.

8. The semiconductor device of claim 1, wherein:
   the internal circuit is a memory circuit.

9. A semiconductor device having an internal circuit and an output buffer for driving output data provided by the internal circuit and transferring the driven output data to an output terminal, the output buffer comprising:
   a first output transistor group for driving the output terminal to a low level;
   a second output transistor group for driving the output terminal to a high level;
   a first pre-output circuit group for driving gates of the first output transistor group; and
   a second pre-output circuit group for driving gates of the second output transistor group,
   wherein the internal circuit being driven by a first power source,
   the first and second pre-output circuit groups being driven by a second power source whose voltage level is different from that of the first power source.

10. The semiconductor device of claim 9, wherein:
    the voltage level of the second power source is lower than that of the first power source; and
    a threshold of the first and second pre-output circuit groups is set according to a voltage difference between the first and second power sources.

11. The semiconductor device of claim 9, wherein:
    at least part of transistors in the first output transistor group form a first small transistor group;
    at least part of transistors in the second output transistor group form a second small transistor group; and
    the transistors in each of the first and second small transistor groups have channel widths set at the ratio of a power of 2.

12. The semiconductor device of claim 11, further comprising:
    first and second impedance controllers for controlling the impedance of the output buffer,
    wherein the first small transistor group including n transistors, where n is a natural number equal to or greater than 2,
    the logic of a signal to drive gates of the n transistors being determined by the first pre-output circuit group according to the logic of the output data provided by the internal circuit and the logic of an n-bit control signal provided by the first impedance controller,
    the second small transistor group including m transistors, where m is a natural number equal to or greater than 2,
    the logic of a signal to drive gates of the m transistors being determined by the second pre-output circuit group according to the logic of the output data and the logic of an m-bit control signal provided by the second impedance controller.

13. The semiconductor device of claim 11, wherein:
    the first small transistor group includes n NMOS transistors having channel widths set at the ratio of $2^0:2^1:\ldots:2^{(n-1)}$ based on a unit channel width, where n is a natural number equal to or greater than 2; and
    the second small transistor group includes m PMOS transistors having channel widths set at the ratio of $2^0:2^1:\ldots:2^{(m-1)}$ based on a unit channel width, where m is a natural number equal to or greater than 2.

14. The semiconductor device of claim 9, wherein:
    sources of transistors in the first output transistor group are connected to a ground voltage and drains thereof are connected to the output terminal; and sources of transistors in the second output transistor group are connected to the second power source and drains thereof are connected to the output terminal.

15. The semiconductor device of claim 9, wherein:
the internal circuit is a memory circuit.

16. A semiconductor device, comprising:

an internal circuit; and an output buffer for driving output data from the internal circuit by a high-level power source voltage and low-level power source voltage and transferring the driven output data to an output node, the output buffer including:

n NMOS tansistors, where n is a natural number equal to or greater than 2, a first end of a current path of each of the n NMOS transistors being connected to the output node, a second end of the current path being connected to the low-level power source, the n NMOS transistors having channel widths set at the ratio of $2^0:2^1: \ldots :2^{(n-1)}$ based on a unit channel width; and n first logic circuits for driving gates of the n NMOS transistors by a voltage that is equal to the high-level power source voltage and differs from a source voltage for driving the internal circuit.

17. The semiconductor device of claim 16, wherein:

the high-level power source voltage is lower than the source voltage for driving the internal circuit; and a threshold of the n first logic circuits is set according to a difference between the high-level power source voltage and the source voltage for driving the internal circuit.

18. The semiconductor device of claim 16, further comprising:

a first circuit for providing an n-bit control signal for controlling the impedance of the output buffer, wherein logic for driving gates of the n NMOS transistors being determined according to the logic of a signal from the internal circuit and the logic of the n-bit control signal from the first circuit.

19. The semiconductor device of claim 16, wherein the output buffer further includes:

m PMOS transistors, where m is a natural number equal to or greater than 2, a first end of a current path of each of the m PMOS transistors being connected to the output node, a second end of the current path being connected to the high-level power source voltage, the m PMOS transistors having channel widths set at the ratio of $2^0:2^1: \ldots :2^{(m-1)}$ based on a unit channel width; and m second logic circuits for driving gates of the m PMOS transistors by a voltage that is equal to the high-level power source voltage and differs from the source voltage for driving the internal circuit.

20. The semiconductor device of claim 19, further comprising:

a second circuit for providing an m-bit control signal for controlling the impedance of the output buffer, wherein logic for driving gates of the m PMOS transistors being determined according to the logic of a signal from the internal circuit and the logic of the m-bit control signal from the second circuit.

* * * * *